US008811020B2

(12) United States Patent  (10) Patent No.: US 8,811,020 B2
Song et al.  (45) Date of Patent: Aug. 19, 2014

(54) STORAGE SERVER SYSTEM

(71) Applicants: Inventec (Pudong) Technology Corporation, Shanghai (CN); Inventec Corporation, Taipei (TW)

(72) Inventors: Er-Zhen Song, Shanghai (CN); Ji-Peng Xu, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 13/778,500

(22) Filed: Feb. 27, 2013

(65) Prior Publication Data

US 2014/0085806 A1  Mar. 27, 2014

(30) Foreign Application Priority Data

Sep. 21, 2012 (CN) .......................... 2012 1 0355147

(51) Int. Cl.
*H05K 5/00* (2006.01)
*H05K 7/00* (2006.01)
*G06F 1/16* (2006.01)

(52) U.S. Cl.
USPC ........... 361/724; 361/725; 361/726; 361/727; 312/223.1; 312/223.2

(58) Field of Classification Search
CPC ..... H05K 5/00; H05K 5/0004; H05K 5/0021; H05K 5/0221; H05K 5/0226; H05K 7/14; H05K 7/1421; H05K 7/1457; H05K 7/1487; H05K 7/1489; G06F 1/18; G06F 1/181; G06F 1/182; G06F 1/183; G06F 1/184; G06F 1/187; G06F 1/188; G06F 1/189; G06F 1/263
USPC ............... 361/724, 725, 726, 727; 312/223.1, 312/223.2
See application file for complete search history.

(56) References Cited

U.S. PATENT DOCUMENTS

| 7,359,186 B2 * | 4/2008 | Honda et al. ............. 361/679.33 |
| 8,045,328 B1 * | 10/2011 | Chen ............................ 361/695 |
| 8,570,754 B2 * | 10/2013 | Li et al. ......................... 361/727 |
| 2006/0041783 A1 * | 2/2006 | Rabinovitz ........................ 714/6 |

* cited by examiner

*Primary Examiner* — Anthony Haughton
(74) *Attorney, Agent, or Firm* — Huffman Law Group, PC

(57) ABSTRACT

A storage server system includes a cage, a midplane, a power supply module, a motherboard module, an HDD backplane, and a data HDD. The cage has a first end and a second end. The midplane is fixed inside the cage. The power supply module is disposed inside the cage. The motherboard module is disposed inside the cage and closer to the first end than the midplane. The HDD backplane is detachably disposed inside the cage. The HDD backplane is closer to the second end than the midplane. The data HDD is detachably disposed inside the cage. After the data HDD and the HDD backplane are detached from each other, the HDD backplane is detached from the cage along a detaching direction towards the second end and away from the first end.

9 Claims, 4 Drawing Sheets

STORAGE SERVER SYSTEM

CROSS-REFERENCE TO RELATED APPLICATIONS

This non-provisional application claims priority under 35 U.S.C. §119(a) on Patent Application No(s). 201210355147.3 filed in China on Sep. 21, 2012, the entire contents of which are hereby incorporated by reference.

BACKGROUND OF THE INVENTION

1. Field of the Invention

The present disclosure relates to a storage server system, and more particularly to a storage server system whose internal electronic devices is disassembled conveniently.

2. Description of the Related Art

Nowadays, information technology is under a rapid development era. Computers, such as desktop or laptop, are widely used by corporations and individuals to handle various tasks. As communication technology becomes more developed, transnational electronic commerce has already replaced regional business transactions. As a result, the electronization of corporations is becoming a development trend. Common personal computers can no longer meet the business requirements of corporations. Therefore, computer companies have developed specialized servers with different functions such as cloud computing, firewall, etc., in order to solve the problems of electronization for corporations.

A typical server comprises a cage and various electronic devices, such as a power supply, a motherboard, a data storing and accessing hard disk driver (HDD), a system HDD and a fan module, and all electronic devices are installed inside the cage. More specifically, the dispositions of the various electronic devices are complicated and interlaced with each other as they are accommodated in a limited space inside the cage. Therefore, when maintenance personnel have to maintain or replace the various electronic devices inside the server, a tremendous amount of time and effort are required for disassembling the server. As a result, the cost for the server maintenance is increased relatively. Therefore, what is needed is for manufacturers to improve the space arrangement of the various electronic devices inside the server limited space in order to enhance the convenience of disassembling the server.

SUMMARY OF THE INVENTION

The storage server system disclosed in the present disclosure comprises a cage, a midplane, a power supply module, a motherboard module, an HDD backplane, and a data HDD. The cage has a first end and a second end disposed oppositely. The midplane is fixed inside the cage. The power supply module is disposed inside the cage and is electrically connected to the midplane. The power supply module is closer to the first end of the cage than the midplane. The motherboard module is disposed inside the cage and is electrically connected to the midplane. The motherboard module is closer to the first end of the cage than the midplane. A plurality of the HDD backplanes is disposed inside the cage and is capable of being detached from the cage, and the HDD backplanes are also electrically connected to the midplane. The HDD backplanes are closer to the second end of the cage than the midplane. The data HDDs are divided into sets and are disposed inside the cage and are capable of being detached from the cage. Each set of the data HDDs is also electrically connected to one of the HDD backplanes. After the data HDDs and the HDD backplanes are detached from each other, the HDD backplanes are adapted to be detached from the cage along a detaching direction towards the second end and away from the first end.

BRIEF DESCRIPTION OF THE DRAWINGS

The present disclosure will become more fully understood from the detailed description given herein below for illustration purposes only, and thus are not limitative of the present disclosure, wherein.

DETAILED DESCRIPTION

The detailed features and advantages of the disclosure are described below in detail through the following embodiments, and the content of the detailed description is sufficient for those skilled in the art to understand the technical content of the present disclosure and to implement the disclosure accordingly. Based upon the content of the specification, the claims, and the drawings, those skilled in the art can easily understand the relevant objectives and advantages of the disclosure.

Figure 1:
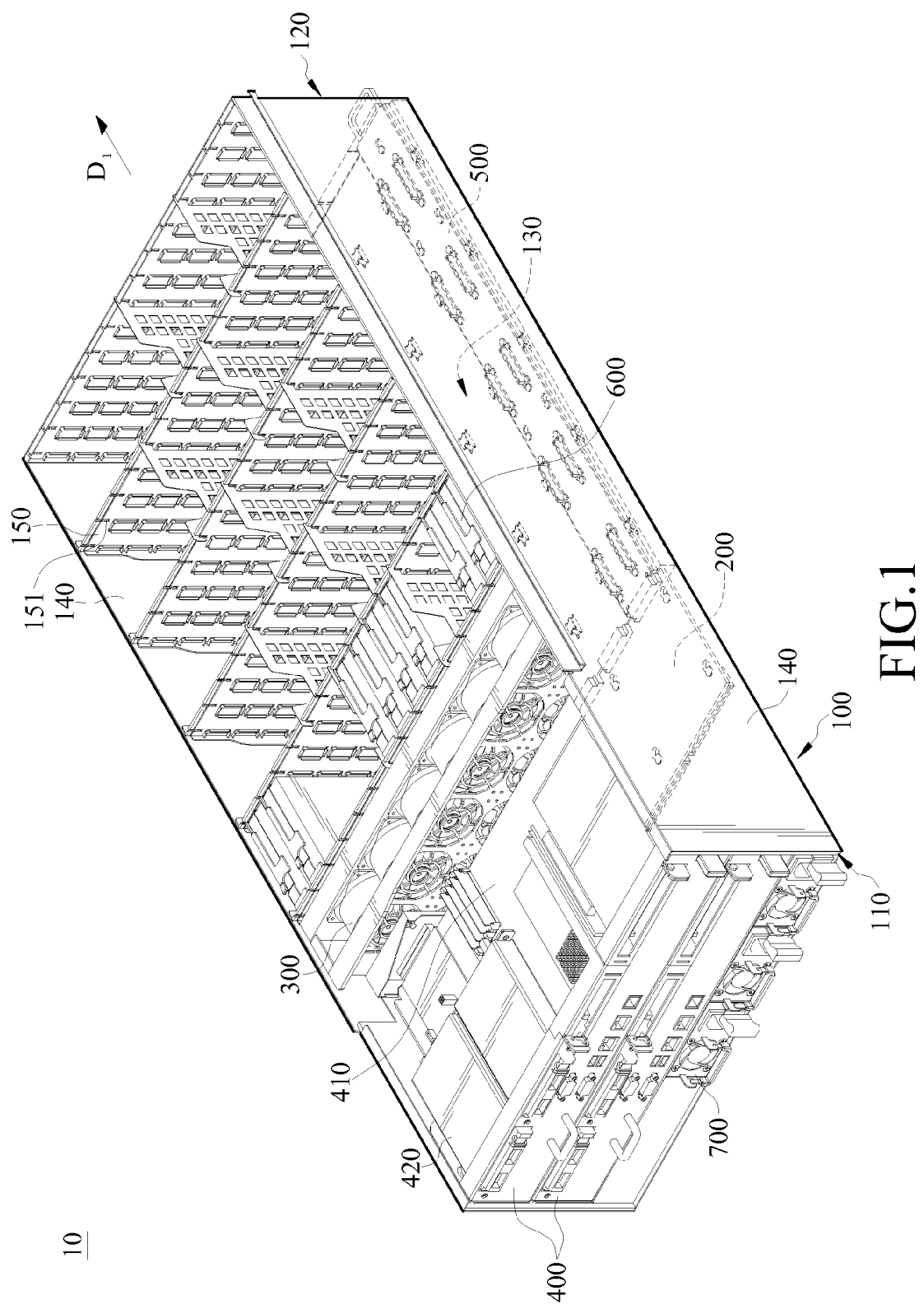
FIG. 1 is a perspective view of a storage server system according to an embodiment of the disclosure.
Figure 2:
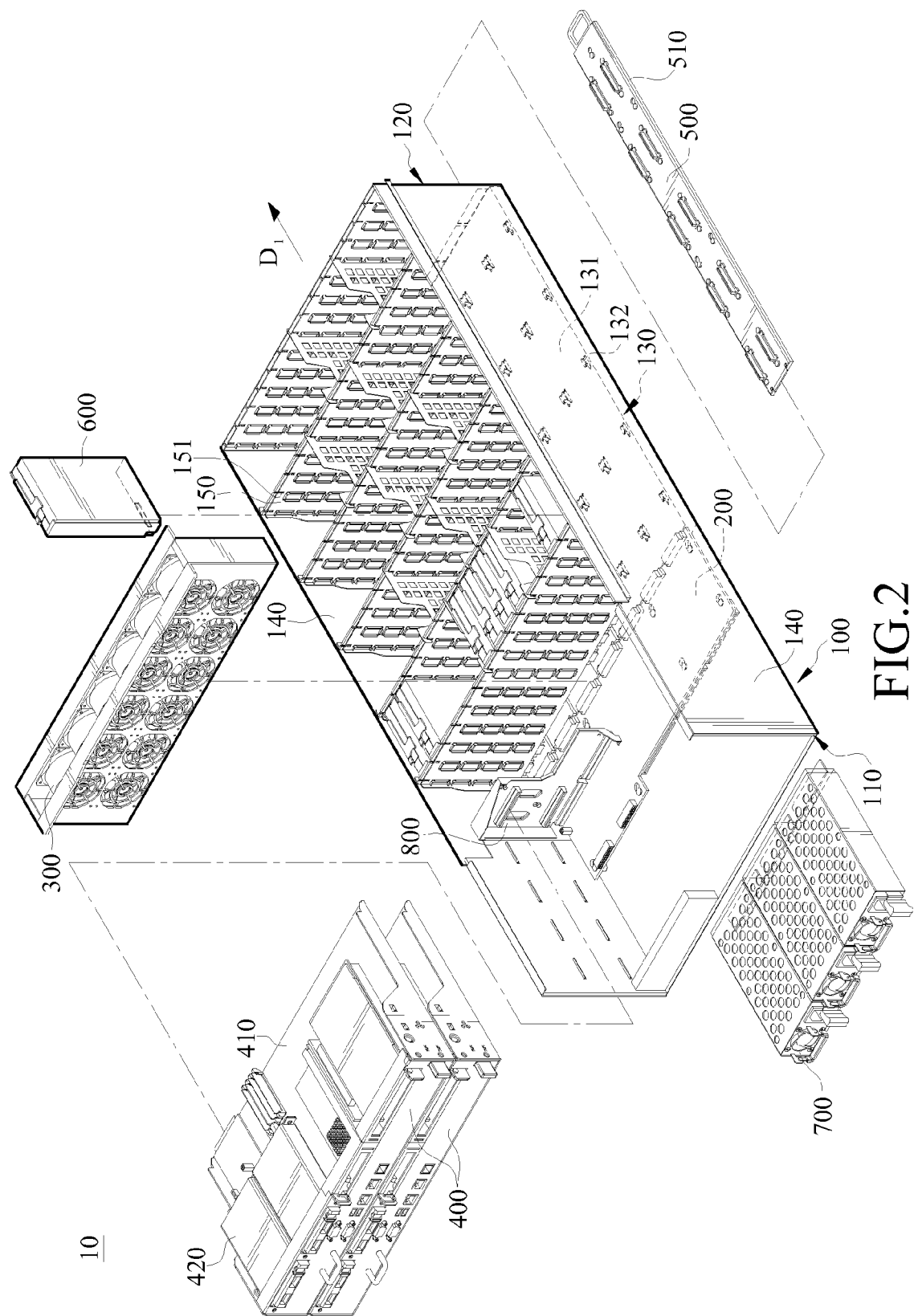
FIG. 2 is an exploded perspective view in FIG. 1.

Please refer to FIGS. 1 and 2. FIG. 1 is a perspective view of a storage server system according to an embodiment of the disclosure and FIG. 2 is an exploded perspective view in FIG. 1.

A storage server system 10 of this embodiment comprises a cage 100, a midplane 200, a power supply module 700, a motherboard module 400, an HDD backplane 500, and a data HDD 600. Furthermore, in this embodiment and some other embodiments, the storage server system 10 further comprises a fan module 300.

The cage 100 comprises a first end 110 and a second end 120 disposed oppositely to each other, and the cage 100 further comprises a bottom plate 130 and two lateral plates 140 disposed by the two opposite sides of the bottom plate 130, respectively. The midplane 200 is fixed on the bottom plate 130 of the cage 100. In this embodiment, the midplane 200 comprises a circuit board. The fan module 300 comprises a plurality of fans. The fan module 300 is disposed inside the cage 100 as well as between the two lateral plates 140, and the fan module 300 is further disposed on the midplane 200. The fan module 300 is used for heat dissipation inside the storage server system 10.

The storage server system 10 further comprises a vertical plane 800. The vertical plane 800 comprises a circuit board. The vertical plane 800 is disposed on the midplane 200 and is electrically connected to the midplane 200.

Furthermore, there are two sets of the motherboard module 400 in this embodiment, and the two motherboard modules 400 are disposed inside the cage 100 and between the two lateral plates 140. Each of the motherboard modules 400 is electrically connected to the vertical plane 800. The two motherboard modules 400 are closer to the first end 110 of the cage 100 than the midplane 200, and one of the motherboard modules 400 is stacked on the other motherboard module 400. Each of the motherboard modules 400 further comprises a motherboard 410 and a system HDD 420. The system HDD 420 is electrically connected to the motherboard 410. Furthermore, in this embodiment and other embodiments, each of the motherboard modules 400 is adapted for being pulled out from the cage 100 along the direction away from the midplane 200 or away from the vertical plane 800 so that each of the motherboard modules 400 can be disassembled from the cage 100.

It is noted that in the above embodiment, the number of the motherboard modules 400 (i.e., two) and the orientation of the motherboard modules 400 (i.e., one motherboard module 400 is stacked on the other motherboard module 400) are exemplary in order to teach the present invention, and the number of motherboard modules 400 and relative disposing positions are not limited to the disclosure. For example, in other embodiments, the number of motherboard modules 400 may be one or more than two. In other embodiments, a plurality of motherboard modules 400 can be arranged side by side inside the cage 100.

The HDD backplanes 500 are elongated circuit boards. The HDD backplanes 500 are disposed on the bottom plate 130 of the cage 100 and can be detached from the cage 100. The HDD backplanes 500 are electrically connected to the midplane 200. The HDD backplanes 500 are closer to the second end 120 of the cage 100 than the midplane 200. It should be noted that the number of the HDD backplanes 500 shown in the drawings (i.e., two) is not limited to the disclosure. In other embodiments, the number of HDD backplanes 500 can be one or more than two.

Furthermore, in this embodiment, the cage 100 further comprises an HDD frame 150. The HDD frame 150 is disposed on the bottom plate 130 and between the two lateral plates 140.

The storage server system 10 in this embodiment comprises a plurality of data HDDs 600. The data HDDs 600 are disposed inside the HDD frame 150 of the cage 100 and are adapted for being detached from the HDD frame 150. Moreover, the HDD frame 150 is used for accommodating the data HDDs 600 so that the data HDDs 600 can be installed inside the HDD frame 150 together. The data HDDs 600 are divided into a plurality of sets. When the data HDDs 600 are installed inside the HDD frame 150, the data HDDs 600 are vertically disposed on the HDD backplanes 500 and are electrically connected to the HDD backplanes 500. Therefore, the data HDDs 600 are electrically connected to the motherboard modules 400 via the HDD backplanes 500, the midplane 200 and the vertical plane 800. Therefore, data may be transmitted between the motherboard modules 400 and the data HDDs 600. After the data HDDs 600 and the HDD backplanes 500 are detached from each other, the HDD backplanes 500 are adapted to be detached from the cage 100 along a detaching direction D1 towards the second end 120 and away from the first end 110 of the cage 100. Therefore, the HDD backplanes 500 can be pulled from the cage 100 away from the motherboard modules 400. Furthermore, the fan module 300 divides the cage 100 into a left area and a right area. The HDD backplanes 500 and the data HDDs 600 are disposed in a first area of the cage 100 closed to the second end 120. The motherboard modules 400 are disposed in a second area of the cage 100 closed to the first end 110. Thus, the space arrangement inside the storage server system 10 can be simplified. When assembly line staff has to assemble or disassemble the HDD backplanes 500 and the data HDDs 600 in the first area, the installation, disassembling, or maintenance of the motherboard modules 400 in the second area will not be affected. Therefore, the assembly line staff can carry out installation and disassembling of the elements in the first area and the second area at the same time in order to enhance the convenience of disassembling the storage server system 10.

The power supply module 700 is disposed on the bottom plate 130 of the cage 100 and between the two lateral plates 140. The power supply module 700 is electrically connected to the midplane 200. The power supply module 700 is closer to the first end 110 of the cage 100 than the midplane 200. The power supply module 700 is disposed below the motherboard modules 400. In this embodiment, the electrical power of the power supply module 700 is transmitted to the motherboard modules 400 via the vertical plane 800 and is also transmitted to the data HDDs 600 via the midplane 200.

Furthermore, in this embodiment, the storage server system 10 further comprises a coupling board 510. The HDD backplanes 500 are fixed on the coupling board 510. The coupling board 510 and the HDD backplanes 500 are disposed on the bottom plate 130 of the cage 100 and can be detached from the bottom plate 130. In this embodiment, the width of the HDD backplanes 500 is smaller than the width of the coupling board 510, and the coupling board 510 and the bottom plate 130 are in contact with each other. The coupling board 510 can be made of metal, and therefore the coupling board 510 is used as a reinforcement plate for the structural stiffness and strength of the HDD backplanes 500.

Figure 3:
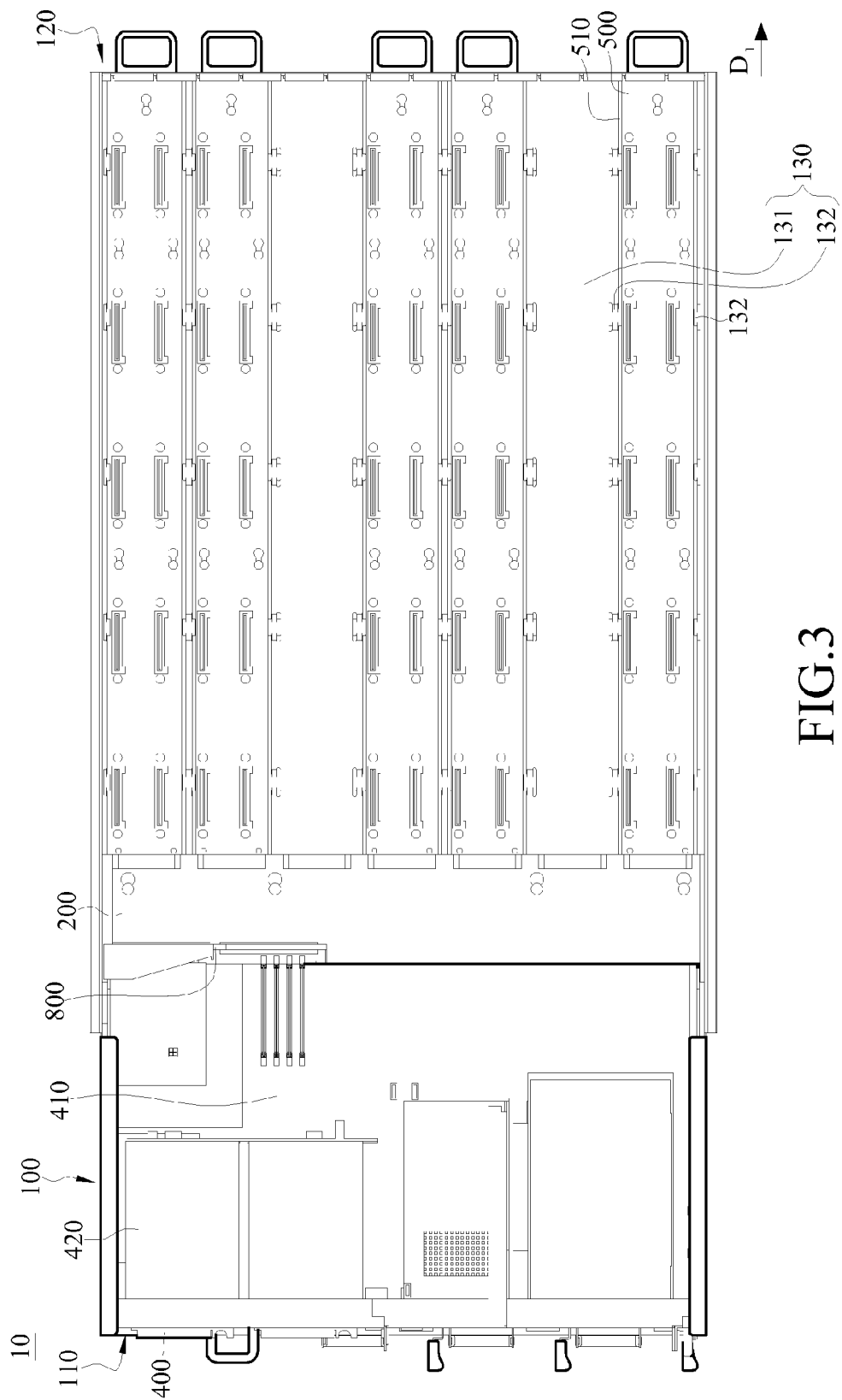
FIG. 3 is a flat view of the storage server system in FIG. 1.

Please refer to FIG. 3 and FIG. 2. FIG. 3 is a flat view of the storage server system in FIG. 1.

In this embodiment, the bottom plate 130 of the cage 100 further comprises a body 131 and two limiting elements 132. The two limiting elements 132 are disposed on and protrude from the body 131. In this embodiment, the limiting elements 132 can be formed to protrude from the body 131 by machining When the HDD backplanes 500 and the coupling board 510 are disposed on the body 131 together, the HDD backplanes 500 and the coupling board 510 are located between the two limiting elements 132. The two limiting elements 132 are pressed against the two opposite sides of the coupling board 510 respectively to limit the displacement directions of the HDD backplanes 500 and the coupling board 510 in relative to the bottom plate 130. Therefore, the coupling board 510 and the HDD backplanes 500 can only be pulled out from the cage 100 along the detaching direction D1. Furthermore, the coupling board 510 is clamped between the two limiting elements 132 and the body 131, and therefore the limiting elements 132 also limit the free movements of the HDD backplanes 500 and the coupling board 510 along a direction which is away from the body 131.

Figure 4:
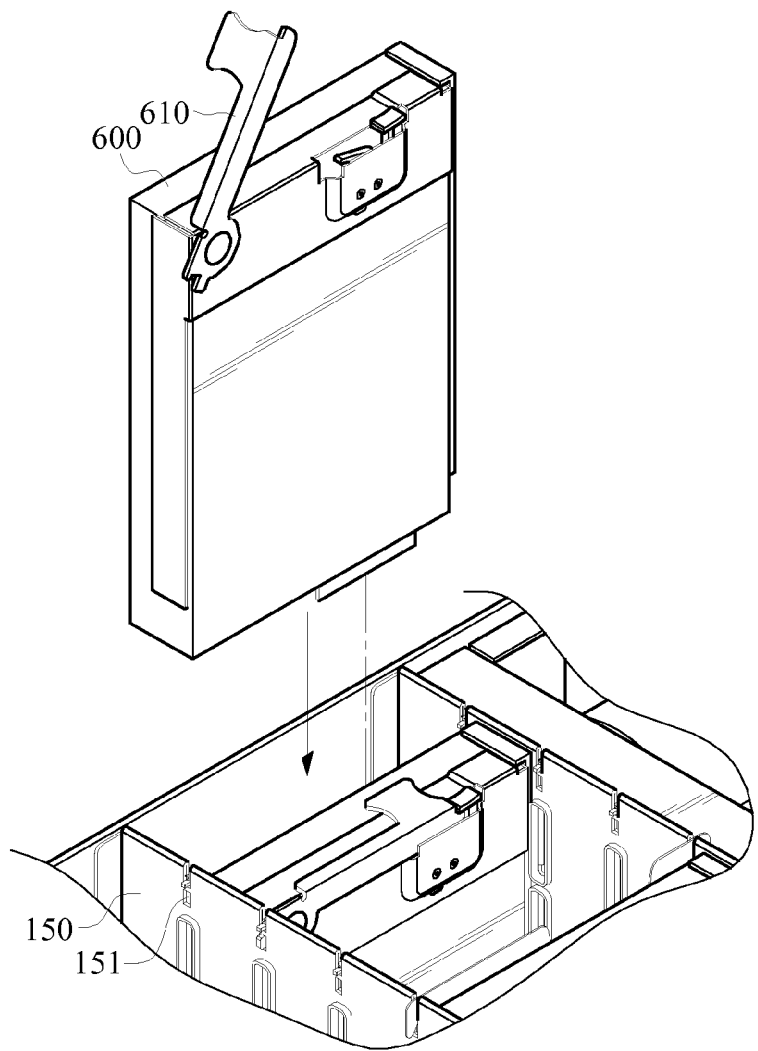
FIGS. 4 and 5 are assembly views of data HDDs and HDD cage in FIG. 1.
Figure 5:
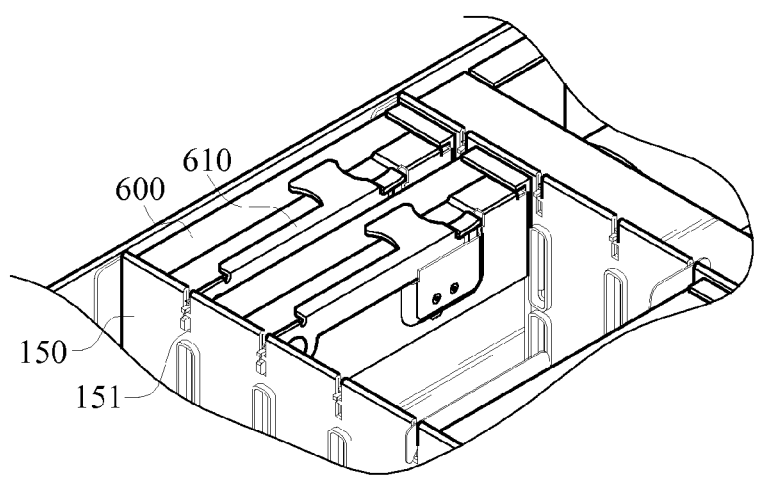

Please refer to FIGS. 4, 5 and 2. FIGS. 4 and 5 are assembly views of the data HDDs and the HDD cage in FIG. 1.

In this embodiment, the HDD cage 150 further comprises a fastening hole 151. The storage server system 10 further comprises a plurality of fastening elements 610. Each of the fastening elements 610 is pivotally connected to the corresponding data HDD 600. Relatively to the data HDD 600, the fastening element 610 has a releasing position (as shown in FIG. 4) vertically positioned above the data HDD 600 and a fastening position (as shown in FIG. 5) horizontally positioned on the data HDD 600. When the fastening element 610 is in the releasing position, the data HDD 600 can be placed inside the HDD frame 150. When the data HDD 600 is disposed inside the HDD frame 150 and the fastening element 610 is turned to the fastening position, the fastening element 610 is fastened inside the fastening hole 151 to fix the data HDD 600 inside the HDD frame 150.

According to the storage server system disclosed in the disclosure, the coupling board and the HDD backplanes are detached from the cage along the detaching direction. Therefore, the HDD backplanes inside the storage server system can be disassembled quickly in order to enhance the convenience of disassembling the storage server system.

Furthermore, the HDD backplanes and the data HDDs are disposed in the first area of the cage near the second end. The motherboard modules are disposed in the second area of the cage near the first end. Thus, the space arrangement inside the storage server system may be simplified. When the assembly line staff has to assemble or disassemble the HDD backplanes and the data HDDs in the first area, the installation, disassembling, or maintenance of the motherboard modules in the second area will not be affected. Therefore, the assembly line staff can carry out installation and disassembling of the elements in the first area and the second area at the same time in order to enhance the convenience of disassembling the storage server system.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A storage server system, comprising:
   a cage having a first end and a second end disposed oppositely to each other;
   a midplane fixed inside the cage;
   a power supply module disposed inside the cage and electrically connected to the midplane, and the power supply module being closer to the first end of the cage than the midplane;
   a motherboard module disposed inside the cage and electrically connected to the midplane, and the motherboard module being closer to the first end of the cage than the midplane;
   a plurality of HDD backplanes disposed detachably inside the cage and electrically connected to the midplane, and the HDD backplanes being closer to the second end of the cage than the midplane; and
   a plurality of data HDDs divided into sets and disposed detachably inside the cage, and wherein each of sets of the data HDDs is electrically connected to one of the HDD backplanes respectively;
   wherein, after one set of the data HDDs and one of the HDD backplanes corresponding to each other are detached from each other, the one of the HDD backplanes is adapted to be detached from the cage along a detaching direction from the first end and towards the second end.

2. The storage server system as claimed in claim 1, wherein the cage further comprises a bottom plate and two lateral plates disposed at two opposite sides of the bottom plate, the two lateral plates are extended from the first end to the second end, the midplane and the HDD backplanes are disposed on the bottom plate, and the power supply module, the motherboard module and the data HDDs are disposed between the two lateral plates.

3. The storage server system as claimed in claim 2, further comprising a coupling board, wherein the HDD backplanes are fixed on the coupling board, the width of the HDD backplanes is smaller than the width of the coupling board, and the coupling board and the HDD backplanes are disposed detachably on the bottom plate.

4. The storage server system as claimed in claim 3, wherein the bottom plate further comprises a body and two limiting elements, the body and the two limiting elements are disposed on the bottom plate, the two limiting elements protrude from the body, the HDD backplanes and the coupling board are disposed on the body, and the two limiting elements are pressed against the two opposite sides of the coupling board respectively in order to limit the HDD backplanes from being detached from the cage along the detaching direction.

5. The storage server system as claimed in claim 1, further comprising a fan module disposed inside the cage, on the midplane, and between the data HDDs and the motherboard module.

6. The storage server system as claimed in claim 1, wherein the motherboard module further comprises a motherboard and a system HDD, and the system HDD is electrically connected to the motherboard.

7. The storage server system as claimed in claim 1, further comprising a vertical plane disposed on the midplane, wherein the vertical plane is electrically connected to the midplane, the power supply module, and the motherboard module, and wherein the vertical plane is used for transmitting power of the power supply module to the motherboard module, and for transmitting the power to the data HDDs via the midplane, and wherein the data HDDs further transmit data to the motherboard module via the midplane and the vertical plane.

8. The storage server system as claimed in claim 1, wherein the cage comprises an HDD frame, and the data HDDs are disposed detachably inside the HDD frame.

9. The storage server system as claimed in claim 8, wherein the HDD frame further comprises a fastening hole, the storage server system further comprises a fastening element pivotally connected on the data HDD, the data HDD is disposed inside the HDD frame, and the fastening element is fastened inside the fastening hole.

* * * * *